United States Patent [19]

Harigane et al.

[11] Patent Number: 4,569,550

[45] Date of Patent: Feb. 11, 1986

[54] APPARATUS FOR AUTOMATICALLY MOUNTING ELECTRONIC CIRCUIT ELEMENT ON PRINTED CIRCUIT BOARD

[75] Inventors: Kotaro Harigane; Tomokazu Takahashi, both of Tokyo, Japan

[73] Assignee: TDK Corporation, Tokyo, Japan

[21] Appl. No.: 621,532

[22] Filed: Jun. 18, 1984

[30] Foreign Application Priority Data

Jul. 15, 1983 [JP] Japan ................... 58-109956[U]
Jul. 21, 1983 [JP] Japan ................... 58-113585[U]

[51] Int. Cl.⁴ .................................... H05K 13/04
[52] U.S. Cl. ..................................... 294/104; 29/741; 294/106; 294/116
[58] Field of Search ............... 294/88, 104, 106, 115, 294/116; 29/739–741, 749, 755, 757, 759, 764, 837–839

[56] References Cited

U.S. PATENT DOCUMENTS

| | | | |
|---|---|---|---|
| 3,564,691 | 2/1971 | Ackerman | 29/741 X |
| 3,636,624 | 1/1972 | Bates | 29/741 X |
| 3,780,415 | 12/1973 | Ragard | 29/741 X |
| 4,141,138 | 2/1979 | Quick | 29/740 |
| 4,179,803 | 12/1979 | Wolkert | 29/741 |
| 4,215,469 | 8/1980 | Asai et al. | 29/741 X |

Primary Examiner—Johnny D. Cherry
Attorney, Agent, or Firm—Frishauf, Holtz, Goodman & Woodward

[57] ABSTRACT

An apparatus for automatically mounting an electronic circuit element on a printed circuit board which is capable of dealing with an electronic circuit element having two lead wires of the large interval, that having two lead wires of the small interval, and that having three lead wires. The apparatus includes a mechanism for holding and transferring an electronic circuit element to a printed circuit board which comprises a fixed pawl formed with a central recess and a pair of side steps, and a pair of movable pawls openable with respect to the fixed pawl wherein the movable pawls are adapted to be in cooperation with the fixed pawl to securely interpose lead wires of an electronic circuit element positioned in the central recess and one of the side steps between one of the movable pawls and the fixed pawl. The apparatus also includes a mechanism for guiding an electronic circuit element to a printed circuit board which comprises a central guide member formed with a central recess and a pair of side recesses, a pair of outer support member openable with respect to the central guide member and an inner support member openable with respect to the central guide member.

12 Claims, 12 Drawing Figures

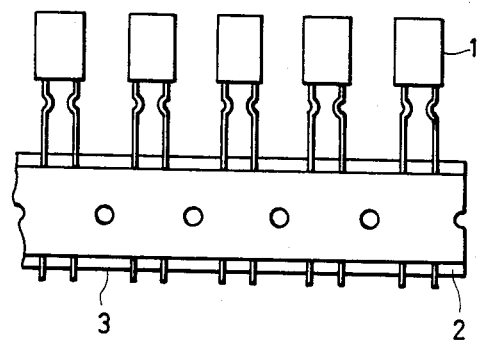
Fig.1
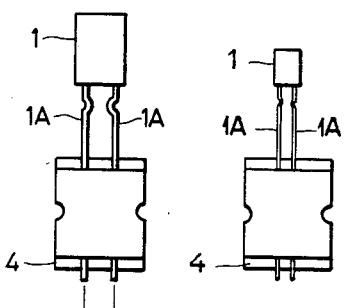
Fig.2A  Fig.2C
Fig.2B

APPARATUS FOR AUTOMATICALLY MOUNTING ELECTRONIC CIRCUIT ELEMENT ON PRINTED CIRCUIT BOARD

BACKGROUND OF THE INVENTION

1. Field of the Invention

This invention relates to an apparatus for automatically mounting an electronic circuit element on a printed circuit board, and more particularly to such an apparatus adapted to deal with an electronic circuit element having two lead wires of the large interval, that having two lead wires of the small interval and that having three lead wires.

2. Description of the Prior Art

An apparatus for automatically mounting an electronic circuit element on a printed circuit board is generally adapted to separate, from a chip tape 3 having electronic circuit elements 1 arranged in a row on a holding tape member 2 as shown in FIG. 1, a section 4 of the tape member 2 having one electronic circuit element 1 held thereon as shown in FIG. 2(A), and remove the electronic circuit element 1 from the section 4. The electronic circuit element 1 removed from the section 4 is then fed to a mechanism for guiding an electronic circuit element to a printed circuit board by means of a transfer mechanism.

Such a transfer mechanism is generally constructed in a manner as shown in FIG. 3. More particularly, the conventional transfer mechanism shown in FIG. 3 comprises an outer block member 10 fixed on a rotary table or the like, an intermediate block member 11 slidably fitted in the outer block member 10, an inner block member 12 slidably fitted in the intermediate block member 11, and a fixed pawl 13 formed at the distal end of the inner block member 12. The transfer mechanism also includes a pair of movable pawls 15 pivotally mounted on both sides of the inner block member 12 by means of pins 14, which are urged to normally open by a spring means.

In the conventional transfer mechanism constructed in the manner described above, the holding of an electronic circuit element 1 is carried out by downward moving the intermediate block member 11 and inner block member 12 together to allow the fixed pawl 13 of the inner block member 12 to be inserted between lead wires 1A of the element 1 and downward moving only the intermediate block member 11 as indicated by an arrow E to close the movable pawls 15, to thereby securely hold the lead wires 1A between recesses 16 formed on the both sides of the fixed pawl 13 and the movable pawls 15.

The recent miniaturization of an electronic circuit element causes an electronic circuit element having an interval of 2.5 mm between lead wires as shown in FIG. 2(B) to appear as well as that having the interval D of 5 mm as shown in FIG. 2(A). Also, when an electronic circuit element is formed to have three lead wires as shown in FIG. 2(C), this causes the interval between the adjacent two lead wires to be 2.5 mm.

Unfortunately, the conventional transfer mechanism, as noted from the above, is constructed to deal with only an electronic circuit element having an interval of 5 mm between the lead wires.

Such a disadvantage is also true of a conventional mechanism for guiding an electronic circuit element to a printed circuit board.

Accordingly, it would be highly desirable to develop an apparatus for automatically mounting an electronic circuit element on a printed circuit board including a transfer mechanism and a mechanism for guiding an electronic circuit element to a printed circuit board which are capable of effectively and positively dealing with an electronic circuit element having two lead wires between which the interval is 2.5 mm and that having three lead wires as well as that having two lead wires between which the interval is 5 mm.

SUMMARY OF THE INVENTION

Accordingly, it is an object of the present invention to provide an apparatus for automatically mounting an electronic circuit element on a printed circuit board which is capable of effectively and positively dealing with an electronic circuit element having two lead wires of the large interval, that having two lead wires of the small interval and that having three lead wires.

It is another object of the present invention to provide such an apparatus including an electronic circuit element transfer mechanism and a mechanism for guiding an electronic circuit element to a printed circuit board which is capable of dealing with an electronic circuit element having two lead wires of the large interval, that having two lead wires of the small interval and that having three lead wires.

It is a further object of the present invention to provide a mechanism for holding and transferring an electronic circuit element to a printed circuit board in an automatic electronic circuit element mounting apparatus which is capable of dealing with an electronic circuit element having two lead wires of the large interval, that having two lead wires of the small interval and that having three lead wires.

It is still a further object of the present invention to provide a mechanism for guiding an electronic circuit element to a printed circuit board in an automatic electronic circuit element mounting apparatus which is capable of dealing with an electronic circuit element having two lead wires of the large interval, that having two lead wires of the small interval and that having three lead wires.

In accordance with the present invention, there is provided an apparatus for automatically mounting an electronic circuit element on a printed circuit board comprising a mechanism for holding and transferring said electronic circuit element to said printed circuit board, said holding and transferring mechanism comprising: a fixed pawl formed at the distal end thereof with a central recess and a pair of side steps arranged to interpose said central recess therebetween; and a pair of movable pawls provided on said fixed pawl to be openable with respect to said fixed pawl; said movable pawls being adapted to be in cooperation with said fixed pawl to allow lead wires of said electronic circuit element respectively positioned in said central recess and one of said side steps to be securely interposed between one of said movable pawls and said fixed pawl.

In accordance with the present invention, there is also provided an apparatus for automatically mounting an electronic circuit element on a printed circuit board comprising a mechanism for holding and transferring said electronic circuit element to said printed circuit board and a mechanism for guiding said electronic circuit element to said printed board;

said holding and transferring mechanism comprising a fixed pawl formed at the distal end thereof with a central recess and a pair of side steps arranged to interpose said central recess therebetween, and a pair of movable pawls provided on said fixed pawl to be openable with respect to said fixed pawl, said movable pawls being adapted to be in cooperation with said fixed pawl to allow lead wires of said electronic circuit element respectively positioned in said central recess and one of said side steps to be securely interposed between one of said movable pawls and said fixed pawl;

said guide mechanism comprising a central guide member having a central recess formed at the distal end thereof and a pair of side recesses formed on both sides thereof, a pair of outer support members openably provided with respect to said central guide member to allow lead wires of said electronic circuit element positioned in said side recesses of said central guide member to be securely interposed between said outer support members and said central guide member, and an inner support member openably provided with respect to said central guide member to allow a lead wire of said electronic circuit element positioned in said central recess of said central guide member to be securely interposed between said inner support member and said central guide member.

In accordance with another aspect of the present invention, there is provided a mechanism for holding and transferring an electronic circuit element to a printed circuit board in an automatic electronic circuit element mounting apparatus comprising a fixed pawl formed at the distal end thereof with a central recess and a pair of side steps arranged to interpose said central recess therebetween; and a pair of movable pawls provided on said fixed pawl to be openable with respect to said fixed pawl; said movable pawls being adapted to be in cooperation with said fixed pawl to allow lead wires of said electronic circuit element respectively positioned in said central recess and one of said side steps to be securely interposed between one of said movable pawls and said fixed pawl.

In accordance with a further aspect of the present invention, there is provided a mechanism for guiding an electronic circuit element to a printed circuit board in an automatic electronic circuit element mounting apparatus comprising a central guide member having a central recess formed at the distal end thereof and a pair of side recesses formed on both sides thereof; a pair of outer support members openably provided with respect to said central guide member to allow lead wires of said electronic circuit element positioned in said side recesses of said central guide member to be securely interposed between said outer support members and said central guide member; and an inner support member openably provided with respect to said central guide member to allow a lead wire of said electronic circuit element positioned in said central recess of said central guide member to be securely interposed between said inner support member and said central guide member.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate the same parts throughout the Figures and wherein:

FIG. 1 is a schematic view showing a chip tape having electronic circuit elements arranged in a row thereon;

FIG. 2(A) is a schematic view of a part of a chip tape having an electronic circuit element with two lead wires which have an interval of 5 mm therebetween;

FIG. 2(B) is a schematic view of a part of a chip tape having an electronic circuit element with two lead wires of which the interval is 2.5 mm;

FIG. 2(C) is a schematic view of a part of a chip tape having an electronic circuit element with three lead wires;

DETAILED DESCRIPTION OF THE PREFERRED EMBODIMENTS

Figure 3:
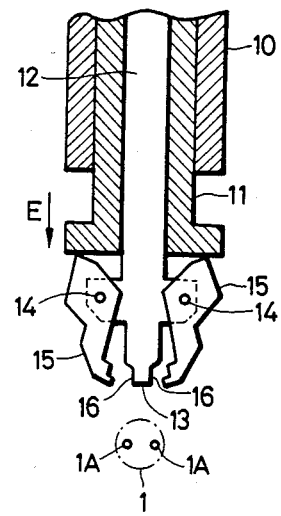
FIG. 3 is a sectional plan view showing a conventional mechanism for holding and transferring an electronic circuit element to a printed circuit board.

Now, an apparatus for automatically mounting an electronic circuit element on a printed circuit board according to the present invention will be described with reference to the accompanying drawings.

FIGS. 4 to 7 illustrate a mechanism for holding and transferring an electronic circuit element to a printed circuit board incorporated in the automatic mounting apparatus of the present invention, which is generally indicated by reference character A. The transfer mechanism A includes an intermediate block member 11A slidably fitted in an outer block member (not shown) constructed in the substantially same manner as the conventional one described above. The intermediate block member 11A has fitted therein an inner block member 12A, which has a fixed pawl 13A formed at the distal end thereof. The inner block member 12A also has a pair of movable pawls 15A and 15B pivotally mounted thereon by means of pins 14A, which are adapted to be urged to normally open by a spring means (not shown). The fixed pawl 13A of the inner block member 12A is formed at the central portion thereof with a recess 20 and at both sides thereof with a pair of steps 21A and 21B. The movable pawl 15A acts to securely hold lead wires X and Y in the step 21A and recess 20 of the fixed pawl 13A in cooperation with the pawl 13A, respectively; whereas the movable pawl 15B serves to securely hold a lead wire Z in the step 21B in cooperation with the fixed pawl 13A.

Figure 4:
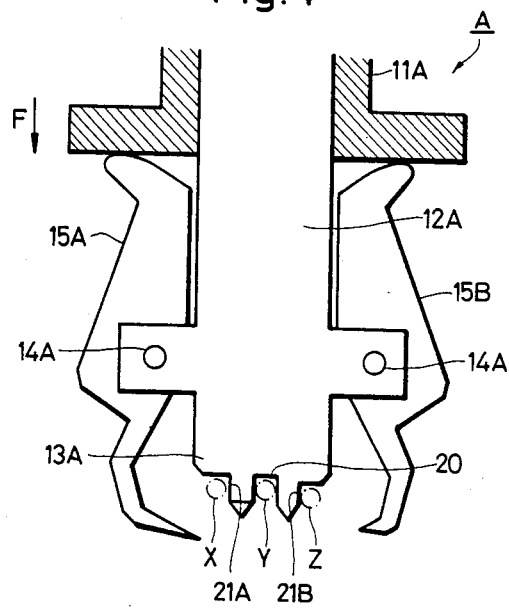
FIG. 4 is a sectional plan view showing a mechanism for holding and transferring an electronic circuit element to a printed circuit board used in an automatic electronic circuit element mounting apparatus according to the present invention wherein movable pawls are in an opened state.
Figure 5:
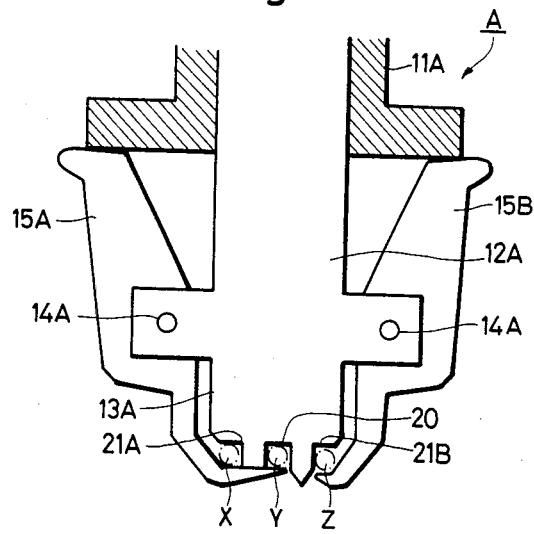
FIG. 5 is a sectional plan view showing the mechanism of FIG. 4 wherein the movable pawls are in a closed state.
Figure 6:
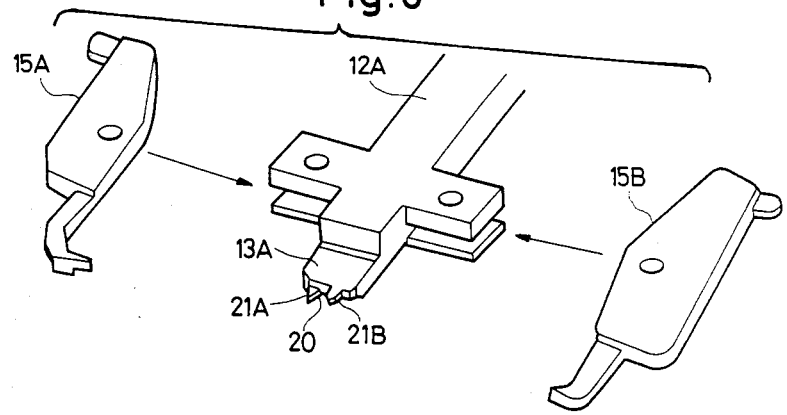
FIG. 6 is an exploded perspective view of the mechanism shown in FIG. 4.
Figure 7:
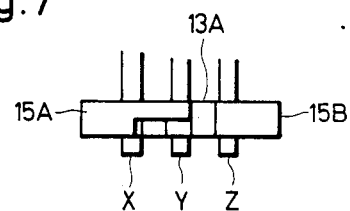
FIG. 7 is a schematic front view showing the distal end portion of the mechanism shown in FIG. 4.

The illustrated transfer mechanism A is adapted to hold and transfer an electronic circuit element with two lead wires having an interval of 5 mm defined therebetween, that with two lead wires having the interval of 2.5 mm and that with three lead wires. The holding of an electronic circuit element with two lead wires X and Z of 5 mm in interval is carried out by downward moving the intermediate block member 11A and inner block member 12A together to respectively position the steps 21A and 21B of the fixed pawl 13A on the lead wires X and Z as shown in FIG. 4, and then downward moving the intermediate block member 11A as indicated by an arrow F to close the movable pawls 15A and 15B, to thereby securely interpose the lead wires X and Z between the steps 21A and 21B of the fixed pawl 13A and the movable pawls 15A and 15B as shown in FIG. 5. Thus, it will be noted that the central recess 20 is not used in this instance.

The holding of an electronic circuit element with two lead wires X and Y (or Y and Z) of 2.5 mm in interval therebetween is accomplished in the following manner.

First, the intermediate block member 11A and inner block member 12A are downward moved together to position the step 21A and the central recess 20 on the lead wires X and Y, respectively, as shown in FIG. 4; and then, only the intermediate block member 11A is downward moved as indicated by the arrow F to close the movable pawls 15A and 15B, to thereby securely interpose the lead wires X and Y between the step 21A and central recess 20 of the fixed pawl 13A and the movable pawl 15A, respectively. Alternatively, when the central recess 20 and step 21B are positioned on the lead wires Y and Z, the lead wires Y and Z are fixedly interposed between the central recess 20 of the fixed pawl 13A and the movable pawl 15A and between the step 21B of the fixed pawl and the movable pawl 15B, respectively.

Further, the holding of an electronic circuit element with three lead wires X, Y and Z is carried out by downward moving the intermediate block member 11A and inner block member 12A together to position the step 21A, central recess 20 and step 21B on the lead wires X, Y and Z, respectively, and then downward moving only the intermediate block member 11A as indicated by the arrow F to close the movable pawls 15A and 15B, to thereby hold the lead wires X, Y and Z between the step 21A, central recess 20 and step 21B of the fixed pawl and the movable pawls 15A and 15B, respectively.

An electronic circuit element of which lead wires have been held by the transfer mechanism is then transferred to a printed circuit board by the mechanism on which the electronic circuit element is to be mounted.

Figure 8:
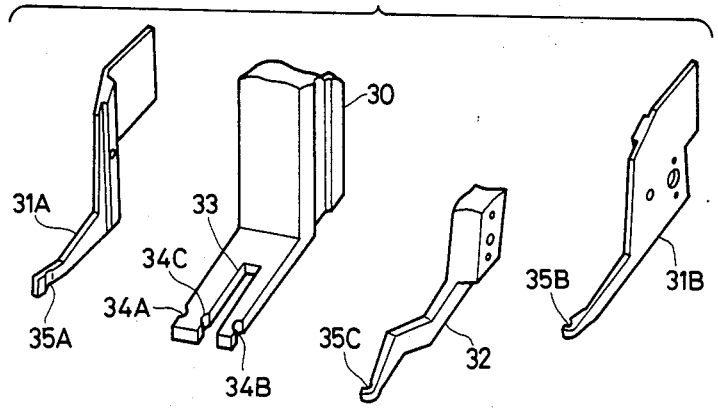
FIG. 8 is an exploded perspective view showing one example of a mechanism for guiding an electronic circuit element to a printed circuit board incorporated in an automatic electronic circuit element mounting apparatus according to the present invention.
Figure 9:
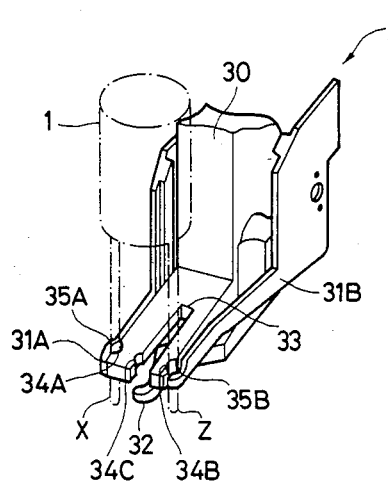
FIG. 9 is a perspective view of the guide mechanism shown in FIG. 8 wherein an electronic circuit element with two lead wires having an interval of 5 mm is held.
Figure 10:
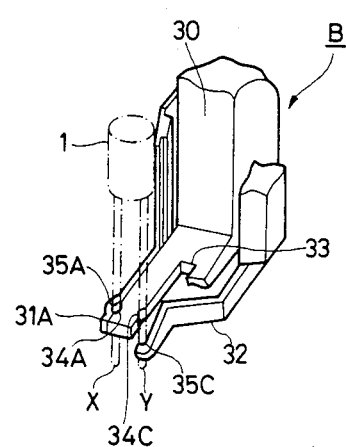
FIG. 10 is a perspective view of the guide mechanism shown in FIG. 8 wherein an electronic circuit element with two lead wires having an interval of 2.5 mm is held.

FIGS. 8 to 10 illustrate a mechanism for guiding an electronic circuit element to a printed circuit board when the element is to be inserted into or mounted on the printed circuit board, which is incorporated in the apparatus for automatically mounting an electronic circuit element on a printed circuit board.

The guide mechanism B shown in FIGS. 8 to 10 includes a central guide member 30 mounted on a block means (not shown) vertically movable with respect to a printed circuit board (not shown) on which an electronic circuit element is to be mounted thereon, a pair of outer support members 31A and 31B provided on both sides of the central guide member 30 to be openable with respect to the central guide member 30, and an inner support member 32 interposed between one of the outer support members or the support member 31B in the embodiment and the guide member 30 to be openable with respect to the guide member 30.

The central guide member 30 is formed into a substantially L-shape and is formed at the lower distal end thereof with a slit-like cutout 33. The cutout 33 has a recess 34C formed on one side thereof. The central guide member 30 is also formed with a pair of recesses 34A and 34B on the both sides of the distal end thereof positionally corresponding to the recess 34C of the cutout 33. The openable outer support members 31A and 31B are formed with recesses 35A and 35B at the portions of the inner surfaces thereof opposite to the recesses 34A and 34B, respectively. Also, the inner support member 32 is formed with a recess 35C at the position opposite to the recess 34C of the cutout 33.

The guide mechanism B constructed in the manner described above is adapted to deal with an electronic circuit element with two lead wires having an interval of 5 mm therebetween, that with two lead wires having the interval of 2.5 mm and that with three lead wires.

The guiding of an electronic circuit element 1 with two lead wires X and Z having the interval of 5 mm, as shown in FIG. 9, is carried out by securely interposing the lead wires X and Z between the side recess 34A of the central guide member 30 and the recess 35A of the outer support member 31A in the closed relationship to the central guide member 30 and between the side recess 34B of the member 30 and the recess 35B of the outer support member 31B closed with respect to the central support member 30 to allow a predetermined operation for mounting an electronic circuit element 1 to be carried out. The supply of an electronic circuit element 1 to the guide mechanism B is attained by the holding and transferring mechanism described above.

An electronic circuit element 1 having two lead wires X and Y of 2.5 mm in interval is guided to a printed circuit board in such a manner as shown in FIG. 10. More specifically, it is carried out by securely interposing the lead wire X between the side recess 34A of the central guide member 30 and the recess 35A of the outer support member 31A closed with respect to the guide member 30 and the lead wire Y between the recess 34C of the cutout 33 of the central guide member 30 and the recess 35C of the inner support member 32 to guide the electronic circuit element to a printed circuit board.

Further, an electronic circuit element having three lead wires X, Y and Z is handled by the guide mechanism in such a manner to support the lead wires X and Z between the side recesses 34A and 34B of the central guide member 30 and the recesses 35A and 35B of the outer support members 31A and 31B in the closed relationships to the central guide member 30 and the lead wire Y between the recess 34C of the cutout 33 of the central guide member 30 and the recess 35C of the inner support member 32 and guide the so-supported electronic circuit element 1 to a printed circuit board.

As can be seen from the foregoing, the apparatus for automatically mounting an electronic circuit element on a printed circuit board according to the present invention can effectively and positively deal with an electronic circuit element having two lead wires of the large interval, that having two lead wires of the small interval and that having three lead wires.

It will thus be seen that the objects set forth above, among those made apparent from the preceding description, are efficiently attained and, since certain changes may be made in the above construction without departing from the spirit and scope of the invention, it is intended that all matter contained in the above description and shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween.

We claim:

1. An apparatus for automatically mounting an electronic circuit element on a printed circuit board comprising a mechanism for holding and transferring said electronic circuit element to said printed circuit board, said holding and transferring mechanism comprising:
   a fixed pawl formed at the distal end thereof with a central recess and a pair of side steps arranged to interpose said central recess therebetween; and
   a pair of movable pawls provided on said fixed pawl to be openable with respect to said fixed pawl;
   said movable pawls being adapted to be in cooperation with said fixed pawl to allow lead wires of said electronic circuit element respectively positioned in said central recess and one of said side steps to be securely interposed between one of said movable pawls and said fixed pawl.

2. An apparatus for automatically mounting an electronic circuit element on a printed circuit board as defined in claim 1, wherein said fixed pawl is mounted on the distal end of the reciprocating means, and said movable pawls are mounted on both sides of said reciprocating means.

3. An apparatus for automatically mounting an electronic circuit element on a printed circuit board as defined in claim 1, wherein a lead wire of said electronic circuit element positioned at the other of said steps of said fixed pawl is securely interposed between said fixed pawl and the other of said movable pawls.

4. An apparatus for automatically mounting an electronic circuit element on a printed circuit board as defined in claim 1 further comprising a mechanism for guiding said electronic circuit element to said printed circuit board, said guiding mechanism comprising:
   a central guide member having a central recess formed at the distal end thereof and a pair of side recesses formed on both sides thereof;
   a pair of outer support members openably provided with respect to said central guide member to allow lead wires of said electronic circuit element positioned in said side recesses of said central guide member to be securely interposed between said outer support members and said central guide member; and
   an inner support member openably provided with respect to said central guide member to allow a lead wire of said electronic circuit element positioned in said central recess of said central guide member to be securely interposed between said inner support member and said central guide member.

5. An apparatus for automatically mounting an electronic circuit element on a printed circuit board as defined in claim 4, wherein said side recesses are provided to positionally correspond to said central recess.

6. An apparatus for automatically mounting an electronic circuit element on a printed circuit board as defined in claim 4, wherein said central guide member is formed into a substantially L-shape and provided at the distal end thereof with a slit-like cutout, said central recess being formed in said cutout.

7. An apparatus for automatically mounting an electronic circuit element on a printed circuit board as defined in claim 4, wherein said outer support members each are provided with a recess which is opposite to each of said side recesses of said central guide member when said outer support members are closed with respect to said central guide member.

8. An apparatus for automatically mounting an electronic circuit element on a printed circuit board as defined in claim 4, wherein said guiding mechanism is provided to reciprocate with respect to said printed circuit board.

9. An apparatus for automatically mounting an electronic circuit element on a printed circuit board as defined in claim 4, wherein said outer support members are mounted on both sides of the rising portion of said central guide member and said inner support member is interposedly mounted between said central guide member and one of said outer support members.

10. An apparatus for automatically mounting an electronic circuit element on a printed circuit board comprising a mechanism for holding and transferring said electronic circuit element to said printed circuit board and a mechanism for guiding said electronic circuit element to said printed circuit board;
   said holding and transferring mechanism comprising
   a fixed pawl formed at the distal end thereof with a central recess and a pair of side steps arranged to interpose said central recess therebetween, and
   a pair of movable pawls provided on said fixed pawl to be openable with respect to said fixed pawl,
   said movable pawls being adapted to be in cooperation with said fixed pawl to allow lead wires of said electronic circuit element respectively positioned in said central recess and one of said side steps to be securely interposed between one of said movable pawls and said fixed pawl;
   said guide mechanism comprising
   a central guide member having a central recess formed at the distal end thereof and a pair of side recesses formed on both sides thereof,
   a pair of outer support members openably provided with respect to said central guide member to allow lead wires of said electronic circuit element positioned in said side recesses of said central guide member to be securely interposed between said outer support members and said central guide member, and
   an inner support member openably provided with respect to said central guide member to allow a lead wire of said electronic circuit element positioned in said central recess of said central guide member to be securely interposed between said inner support member and said central guide member.

11. A mechanism for holding and transferring an electronic circuit element to a printed circuit board in an automatic electronic circuit element mounting apparatus, comprising:
- a fixed pawl formed at the distal end thereof with a central recess and a pair of side steps arranged to interpose said central recess therebetween; and
- a pair of movable pawls provided on said fixed pawl to be openable with respect to said fixed pawl;
- said movable pawls being adapted to be in cooperation with said fixed pawl to allow lead wires of said electronic circuit element respectively positioned in said central recess and one of said side steps to be securely interposed between one of said movable pawls and said fixed pawl.

12. A mechanism for guiding an electronic circuit element to a printed circuit board in an automatic electronic circuit element mounting apparatus, comprising:
- a central guide member having a central recess formed at the distal end thereof and a pair of side recesses formed on both sides thereof;
- a pair of outer support members openably provided with respect to said central guide member to allow lead wires of said electronic circuit element positioned in said side recesses of said central guide member to be securely interposed between said outer support members and said central guide member; and
- an inner support member openably provided with respect to said central guide member to allow a lead wire of said electronic circuit element positioned in said central recess of said central guide member to be securely interposed between said inner support member and said central guide member.

* * * * *